United States Patent [19]

Wiedmann et al.

[11] Patent Number: 5,121,357

[45] Date of Patent: Jun. 9, 1992

[54] STATIC RANDOM ACCESS SPLIT-EMITTER MEMORY CELL SELECTION ARRANGEMENT USING BIT LINE PRECHARGE

[75] Inventors: Siegfried K. Wiedmann, Stuttgart; Dieter F. G. Wendel, Sindelfingen, both of Fed. Rep. of Germany

[73] Assignee: International Business Machines Corporation, Armonk, N.Y.

[21] Appl. No.: 516,648

[22] Filed: Apr. 30, 1990

[51] Int. Cl.$^5$ .............................................. G11C 13/00
[52] U.S. Cl. ................................... 365/203; 365/174; 365/179; 365/190
[58] Field of Search ................ 365/179, 190, 203, 174

[56] References Cited

U.S. PATENT DOCUMENTS

| | | | |
|---|---|---|---|
| 4,319,344 | 3/1982 | Heuber et al. | 365/203 |
| 4,769,785 | 9/1985 | Guo | 365/179 |
| 4,858,183 | 8/1989 | Scharrer | 365/179 |
| 4,864,540 | 9/1989 | Hashemi | 365/179 |

OTHER PUBLICATIONS

"High Speed-Emitter $I^2L$/MTL Memory Cell" by S. K. Wiedmann et al. IEEE Journal of Solid State Circuits, vol. SC-16, No. 5, Oct. 1981 p. 429.

Primary Examiner—Terrell W. Fears
Attorney, Agent, or Firm—Thomas J. Kilgannon; Blaney B. Harper

[57] ABSTRACT

This invention relates generally to the static, random access, semiconductor memory arrays which incorporate split-emitter memory cells. The latter are accessed during a read cycle of a selected memory cell by precharging all the bit lines of unselected memory cells associated with the word line of the selected cell. This is accomplished by switchably connecting a voltage source to all the unselected bit lines which charges their bit line capacitances. Then, when read current sources are switchably connected to both the selected and unselected memory cells and the associated word line is switched to a WORD SELECT source, the read current associated with the unselected bit lines flows via charging switches to the precharge voltage sources and the read current associated with the selected bit lines along with dynamic current from uncharged selected bit line capacitances flows into the selected cell. This approach prevents large, dynamic bit line currents from discharging the bit line capacitances of the unselected cells into those cells along with read currents.

14 Claims, 6 Drawing Sheets

STATIC RANDOM ACCESS SPLIT-EMITTER MEMORY CELL SELECTION ARRANGEMENT USING BIT LINE PRECHARGE

DESCRIPTION

Field of the Invention

This invention relates generally to the static, random access, semiconductor memory arrays and, more specifically, to a static random access memory array which incorporates split-emitter memory cells. The latter are accessed during a read cycle of a selected memory cell by precharging all the bit lines of unselected memory cells associated with the word line of the selected cell. This is accomplished by switchably connecting a voltage source to all the unselected bit lines which charges their bit line capacitances. Then, when read current sources are switchably connected to both the selected and unselected memory cells and the associated work is switched to a WORD SELECT source, the read current associated with the unselected bit lines flows via charging switches to the precharge voltage sources and the read current associated with the selected bit lines flows into the selected cell. This approach prevents large dynamic bit line currents which normally result from discharging the bit line capacitances of the unselected cell into that cell along with read currents. In addition, because the read current sources can be activated relatively late in this regime, low speed complementary transistor switches can be used resulting in considerable power savings.

BACKGROUND OF THE INVENTION

Memory arrays which incorporate bipolar, split-emitter memory cells are well known in the bipolar memory array art. A memory array incorporating the usual read selection approach is shown in an article entitled "High-Speed Split-Emitter I$^2$L/MTL Memory Cell" by S. K. Wiedmann, D. D. Tang and R. Beresford in IEEE Journal of Solid State Circuits, Vol. SC-16, No. Oct. 5, 1981, pages 429-434. The article is hereby incorporated by reference to show the state of the art. FIG. 1 of the present application shows a memory cell identical to FIG. 1 of the article which will be discussed hereinbelow in some detail. Also, while the article goes into detail to show the read-write selection approaches used, FIG. 2 of the present application will be discussed hereinbelow specifically in connection with the read selection approach of the prior art. To the extent that additional delays can occur under a worst-case bit patters (when all the unselected cells are storing a different value from the selected cell), the prior art has neither recognized or provided a solution to this problem. The present teaching minimizes cell access time while at the same time, minimizing the drive power required.

U.S. Pat. No. 4,319,344 filed May 30, 1980 and assigned to the same assignee as the present application, shows an MTL memory array in which a selected pair of bit lines is discharged through a selected cell coupled to the selected pair of bit lines while simultaneously the nonselected pairs of bit lines are discharged through a common switch into nonselected word lines. In the present application, prior to the word select, all the nonselected bit lines are precharged to a reference voltage, that is about 600 mV lower than the bit line voltage at standby, during a read cycle while the selected bit line capacitances are not charged at all.

It is, therefore, an object of the present invention to reduce additional delay during a read cycle due to a worst-case bit pattern on the memory cell array while simultaneously minimizing required drive power.

Another object of the present invention is to provide for the precharging of unselected bit lines to that upon actuation of the read current sources to all bit lines, the read currents of the selected cell flow to the selected word line.

Yet another object of the present invention is to prevent dynamic currents of unselected cells from flowing into the booster resisters of the selected cell by charging only the bit line capacitances of unselected cells.

Still another object of the present invention is to provide a cell selection approach which minimizes cell read delay.

BRIEF SUMMARY OF THE INVENTION

This invention relates to static, random access, semiconductor memory arrays which utilize split-emitter memory cells. A selected memory cell is accessed during a read cycle by subjecting all the bit lines of unselected memory cells associated with the same word line of the selected cell to a precharge of their bit line capacitances. Voltage sources are connected via actuatable switches to each of the unselected bit lines to charge their bit line capacitances. When read current sources are connected to both selected and unselected memory cells and the associated word line is switched to its WORD SELECT source, the read current associated with the unselected bit lines flows via the charging switches to the precharge voltage sources. At the same time, the read current associated with the selected bit lines flows into the selected cell where the differential voltage across the cell is sensed by an associated sense amplifier. Because the bit line capacitances of the unselected cells are precharged, large dynamic word line currents are not present. In addition, the present cell select approach virtually eliminates any dynamic incorrect read signal such as occurs when a worst-case bit pattern appears in conventional read select approaches. Also, read delays are minimized so that the overall access time is also minimized because all portions of the read cycle begin substantially simultaneously.

The foregoing and other objects, features and advantages of the present invention will become more apparent from the following more particular description of a preferred embodiment.

DESCRIPTION OF A PREFERRED EMBODIMENT

Figure 1:
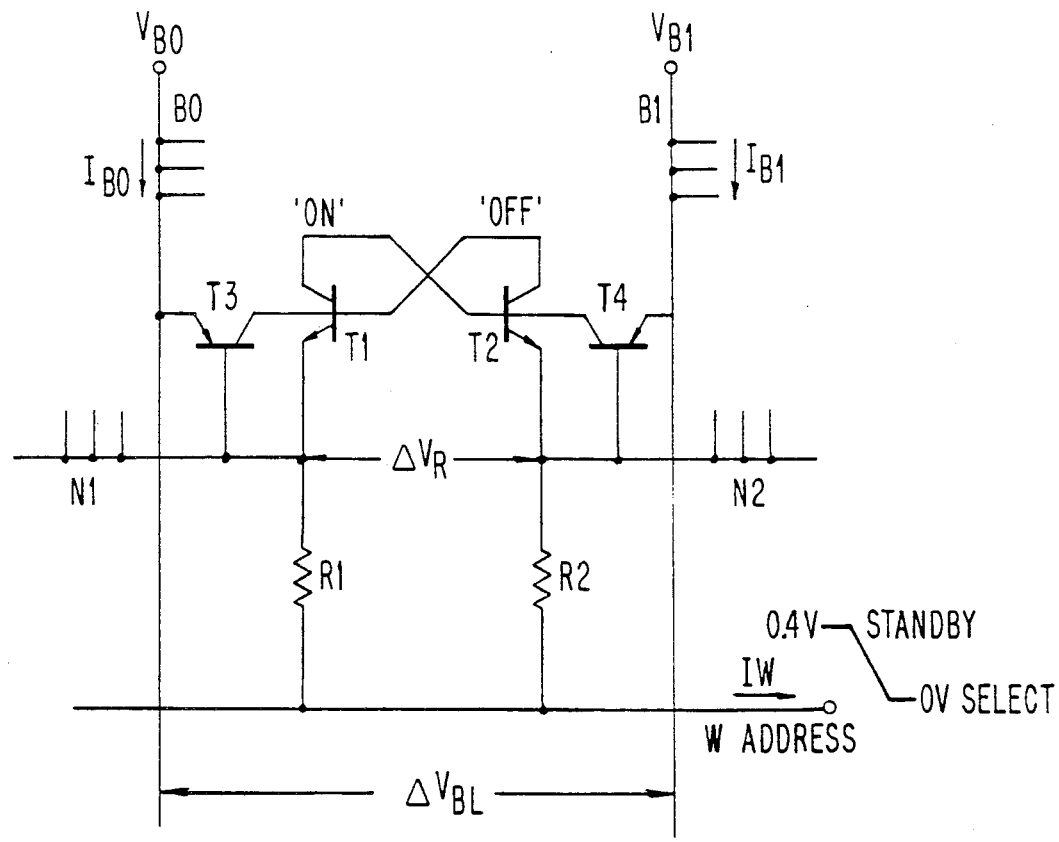
FIG. 1 is a schematic drawing of a prior art split emitter memory cell which is utilized in an array of memory cells in the practice of the present invention.

FIG. 1 shows a schematic diagram of a prior art split-emitter cell which is utilized in an array of memory cells in the practice of the present invention. In FIG. 1, NPN transistors T1,T2 are inverting transistors while PNP transistors T3,T4 serve as load devices. Bit lines B0,B1 are shown connected to the emitter of transistors T3,T4, respectively, while emitters of transistors T1,T2 are coupled via booster resistor R1,R2 to the word address line, W-ADDRESS. The collectors of transistors T1,T2 are cross-coupled to the bases of transistors T2,T1, respectively. As indicated hereinabove, the memory cell of FIG. 1 is described and discussed in detail in the IEEE Journal of Solid-State Circuits, Vol. SC-16, pages 429-439, October 1981 by S. K. Wiedmann et al. To the extent there is interest in the operation of the circuit of FIG. 1, this information can be readily obtained from the above mentioned article and from the description of some of the FIGS. which follow. The new memory select approach of the present application is particularly suited to the split-emitter memory cell shown in FIG. 1 and described in detail in the above mentioned reference. In contrast to still earlier very high-density MTL (Merged Transistor Logic) memory cells, the split-emitter memory cell of FIG. 1 delivers fairly large sense DC signals which significantly improve cell access time. In spite of relatively large time constants of the cell PNP and inverted NPN transistors, a cell delay of about 5 nanoseconds has been achieved based on a prior art cell select scheme shown in the following FIG. 2. A major drawback of the prior art approach shown in FIG. 2 is the fact that the cell read delay is considerably increased if a "worst-case" bit pattern ("0" in all memory cells except the selected cell) is experienced by the memory array.

Figure 2:
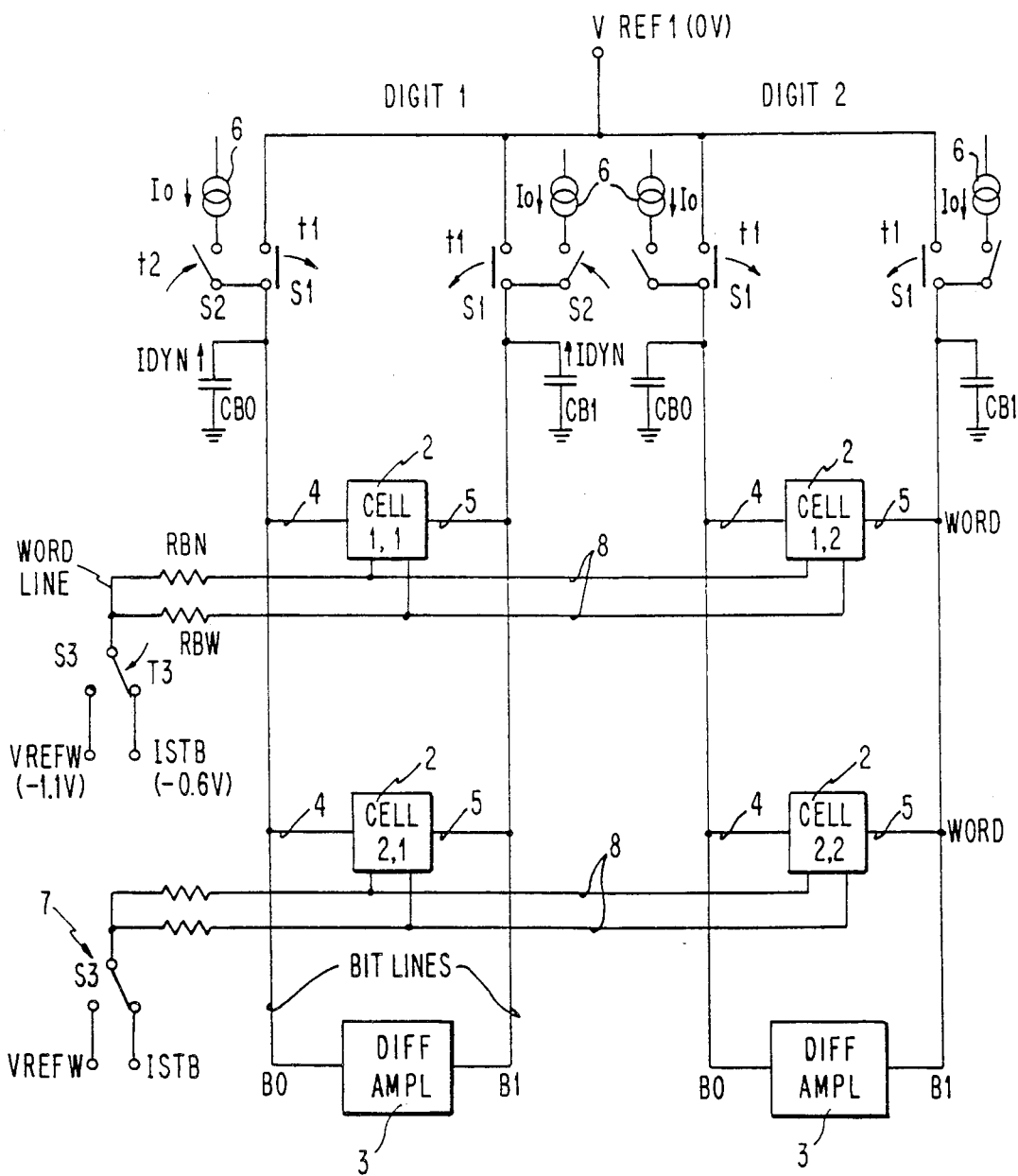
FIG. 2 is a partially block diagrammatic circuit of a prior art memory array using the split emitter memory cell shown in FIG. 1.

FIG. 2 is a partially schematic, partially block diagram of a prior art memory array using the split-emitter memory cells of FIG. 1 which, though it shows but four cells, is representative of memory arrays incorporating thousands of such cells. In FIG. 2, memory array 1 includes a plurality of split-emitter memory cells 2 arranged in rows and colums. Differential amplifiers 3 are shown connected to pairs of bit lines B0,B1 which are, in turn, connected to memory cells 2 via interconnections 4,5. Interconnections 4,5 connect bit lines B0,B1 to the emitters of transistors T3,T4, respectively, shown in FIG. 1. Bit lines B0,B1 each have bit line capacitances represented in FIG. 2 by capacitors CB0,CB1, respectively, between bit lines B0,B1, respectively, and ground. All of the bit line pairs are connected to a source of reference voltage VREF1 which, for present purposes, has a value of zero (0) volts. A bit line switch, S1, is shown serially disposed in each of the bit line pairs B0,B1. Switches S1 are closed in the standby mode connecting bit lines B0,B1 and their associated capacitances CB0,CB1 to VREF1. Read-write current sources 6 are shown in FIG. 2 connected to each bit line, B0,B1 via a read current switch S2 which is open in standby mode. Read current, Io, is provided to each of the bit lines B0,B1 when switch S2 is closed.

Memory cells 2 in FIG. 2 are shown connected to a word select source 7 via common booster resistors RBW, word line interconnections 8 and word select switch S3. Interconnections 8 connect to the emitters of transistors T1,T2 of the memory cell shown in FIG. 1. Sources 7 include two sources, voltage source, VREFW and standby current source, ISTB. The latter is normally connected via one contact of switch S3 to an interconnection 8. When word select switch S3 is actuated, however, an interconnection 8 is connected via the other contact of S3 to voltage source, VREFW.

In FIG. 2, the left hand pair of bit lines B0,B1, are associated with a column of memory cells 2 otherwise identified in FIG. 2 as DIGIT 1. The right hand pair of bit lines B0,B1 are associated with a column of memory cells 2 identified as DIGIT 2. Similarly, the uppermost row of memory cells 2 is otherwise identified as WORD 1 and the lowermost row of cells 2 is otherwise identified as WORD 2. Using these identifiers, memory cell 2 associated with DIGIT 1, WORD 1 can be otherwise identified in FIG. 2 as cell 1,1. Cell 1,2, cell 2,1 and cell 2,2 are similarly identified using the same associations.

Figure 3:
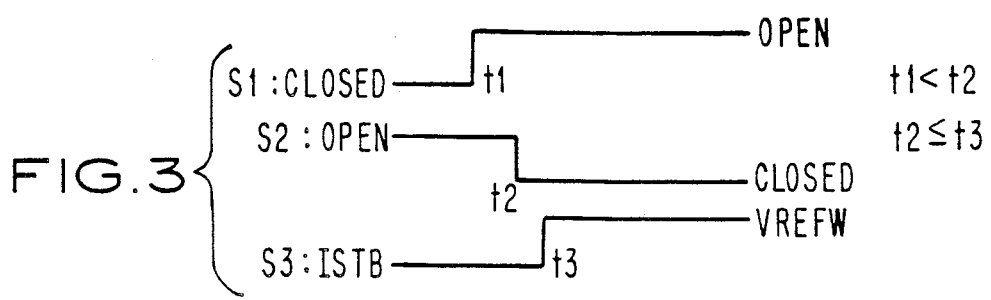
FIG. 3 is a graphical representation showing the position of switches S1, S2, S3 versus time when a prior art cell selection approach for a read operation is used in conjunction with the memory array of FIG. 2.

FIG. 3 is a graphical representation showing the position of switches S1, S2. S3 versus time when a prior art cell selection approach for a read operation is used in conjunction with the memory array of FIG. 2. Thus, to read the contents of memory cell 1,1 of array 1, switch S1 is first actuated at time, t1, as shown in FIG. 3. Actuation of switch S1, disconnects bit lines B0,B1 associated with cell 1,1 from their standby power supply, VREF1. Subsequently, at time t2, as shown in FIG. 3, read current sources 6 of the selected bit line pair B0,B1 associated with cell 1,1 are connected to those bit lines by actuating switches S2. immediately thereafter, at time t3, switch S3 is disconnected from from source ISTB and connected to source VREFW, pulling the selected word line down to a lower voltage. Where source ISTB is −0.6 volts and VREFW is −1.1 volts, the selected word line is pulled down by about 500 mV. Due to this lowering of voltage in the selected word line, the read current, Io, flows into memory cell 1,1 only, causing a voltage difference at the associated bit lines, B0,B1 depending on the state of memory cell 1,1. Note that no read current, Io, flows into memory cell 1,2 because, even though associated with a selected word line, it is also associated with unselected bit lines whose switches S2 are unactuated.

In addition to the DC current, Io, there is a dynamic bit line current, IDYN, which results from the discharging of the bit line capacitors, CB0,CB1 associated with the selected bit lines. Still another component of the total read current consists of the back-injection current of all the unselected cells associated with the selected bit lines. This current is essentially as big as the cell standby current and it only appears at the ON-side of the unselected cells. Thus, if all the unselected cells have the opposite information to that of the selected cell, the fairly large instantaneous, asymmetrical bit line currents of the unselected cells are superimposed on the read signal currents resulting in the read delay shown in FIG. 4 below. This effect is magnified by a worst-case bit pattern of the unselected cells of the same word line having the same booster resistors, RBW.

Figure 4:
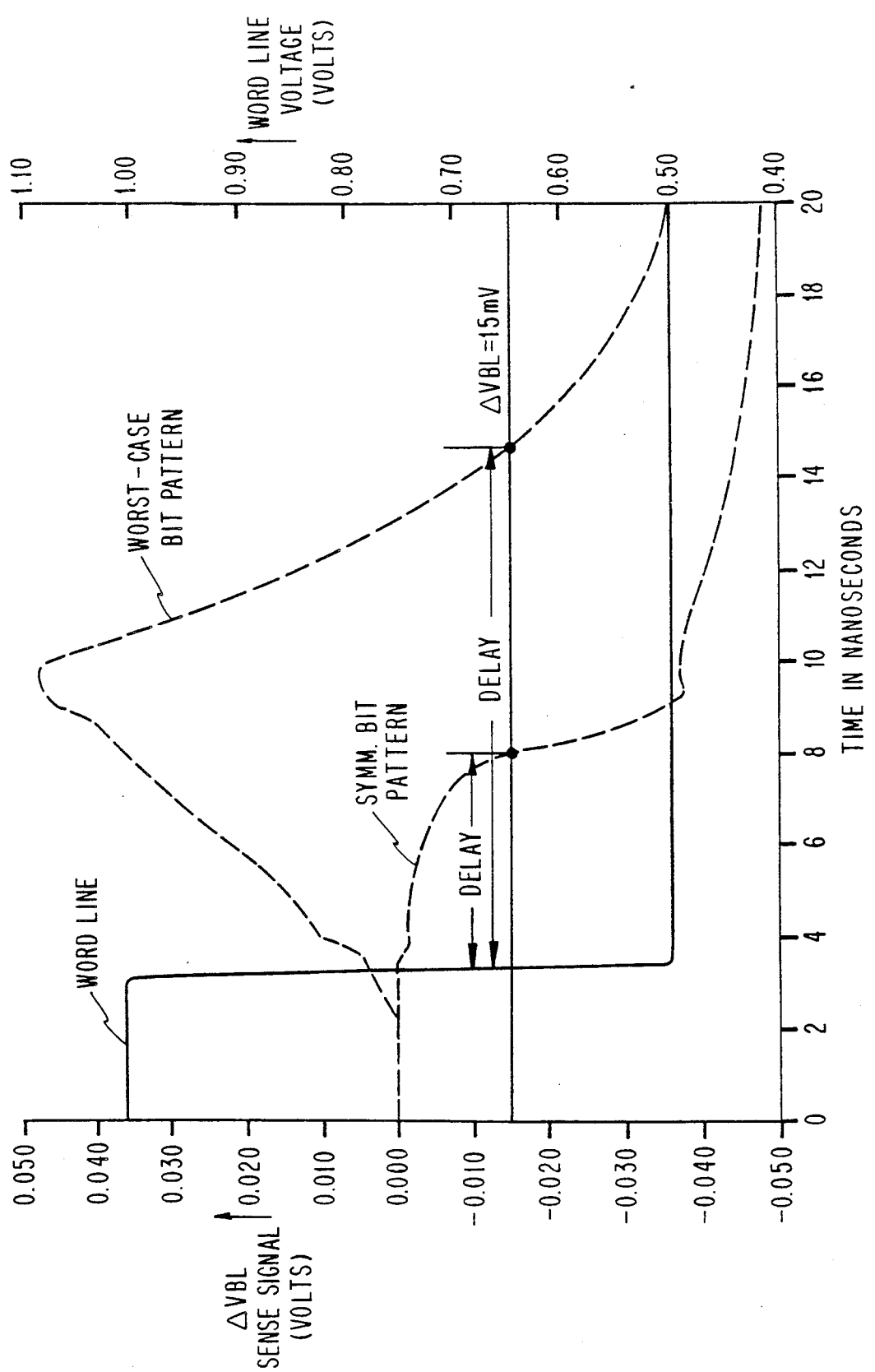
FIG. 4 is a plot of Bit Line Sense Signals and Word Line Voltage in volts versus time in nanoseconds obtained using the prior art circuit of FIG. 2.

Referring now to FIG. 4, there is shown a plot of Bit Line Sense Signals and Word Line Voltage in volts versus Time in nanoseconds when prior art or conventional sensing approaches are utilized. The plot shows the sense signals obtained when a symmetrical bit pattern (when fifty percent of the cells of the array store a binary one and the remaining fifty percent of the cells store a binary zero) has been stored in the array of FIG. 2 and when a worst-case bit pattern is stored in the same array. The former pattern produces a read delay of approximately 5 ns while the latter pattern produces a read delay of approximately 11 ns. The large delay produced when a worst-case bit pattern is stored in the array is unacceptable because the overall circuit design must take into account the possibility that such large delays will occur.

Figure 5:
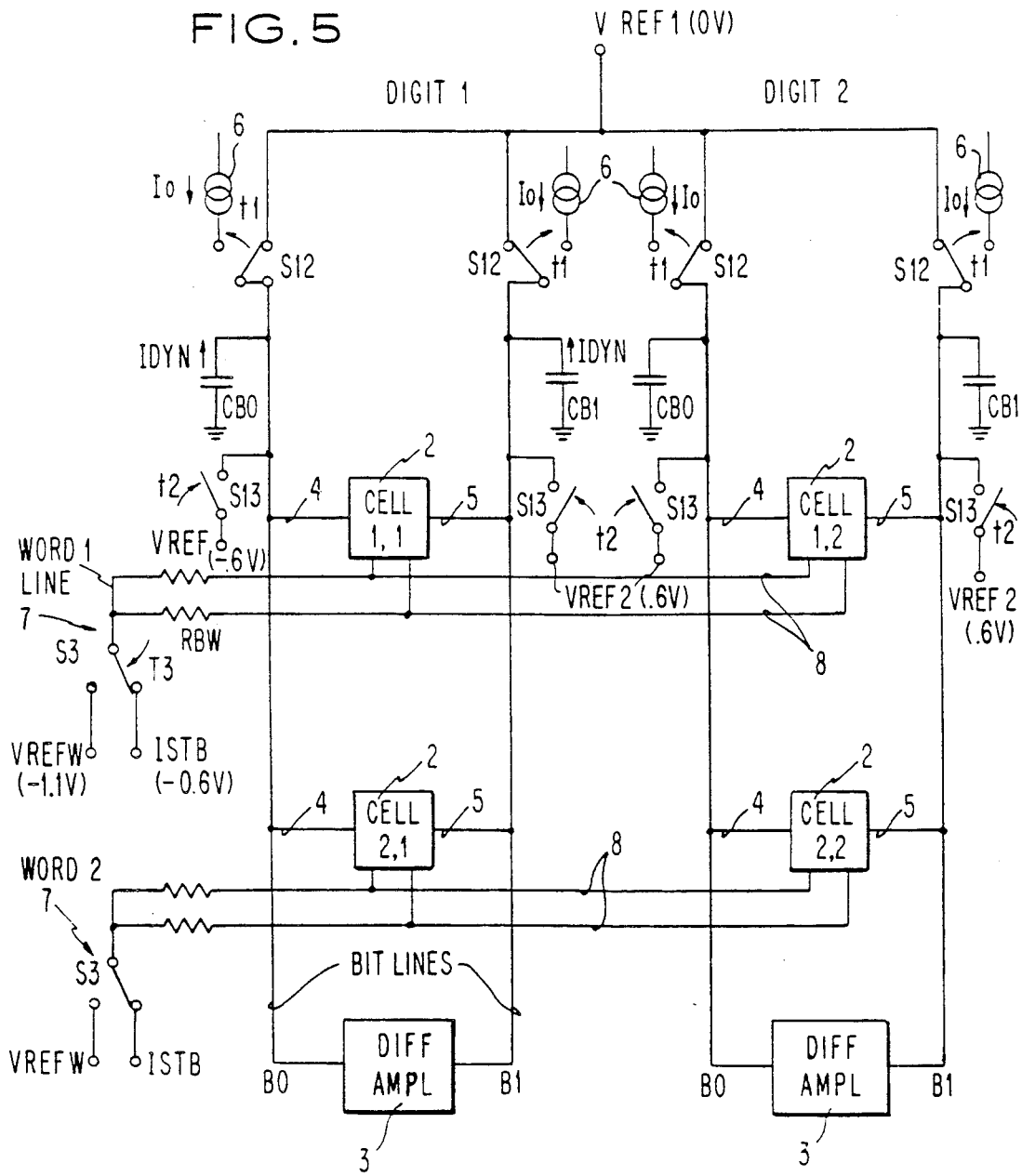
FIG. 5 is a partially schematic, partially block diagrammatic circuit of a split emitter memory array which incorporates a means for precharging unselected bit lines.

To overcome the drawback of increased read delays for the worst-case bit pattern, the circuit shown in FIG. 5 not only reduces the delay due to worst-case bit patterns, but also reduces it to a value less than that obtained for symmetrical bit patterns using the prior art circuit of FIG. 3.

FIG. 5 is a partially schematic, partially block diagrammatic circuit of a splitemitter memory cell array which, among other things, incorporates a means for precharging unselected bit lines slightly before the application of a word select signal. The same reference characters which were used in FIG. 3 are used in FIG. 5 where the elements which they identify are the same. Thus, the circuits of FIG. 3 and FIG. 5 are identical except that switches S1 and S2 of FIG. 3 have been combined into a switch S12 in FIG. 5 and a new precharging switch S13, which connects a precharging source, VREF2, to each of the bit lines, B0,B1, has been added. In the circuit shown in FIG. 5, switch S12 provides standby, restore or read currents depending on whether it is connected to source 6 or VREF1. Switch S13 provides for unselected bit line precharge and S3 provides for word line selection or standby depending on whether it is connected to VREFW or ISTB.

Figure 6:
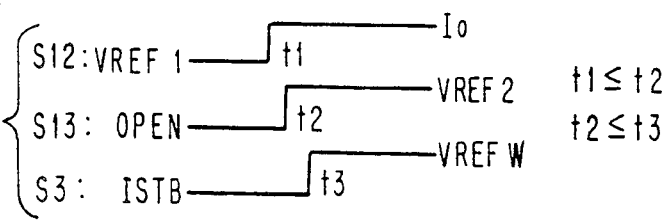
FIG. 6 is a graphical representation showing the condition of switches S12, S13 and S3 versus time in the array of FIG. 5.

FIG. 6 shows the condition of switches S12,S13, and S3 versus time which, when actuated as shown in the circuit of FIG. 5, minimizes all the possible read delays.

Considering now the circuit of FIG. 5 in conjunction with the pattern shown in FIG. 6, it is seen that switches S12 are first actuated disconnecting both selected and unselected bit lines from source VREF1. At substantially the same time, switches S12 connect read current sources 6 to both the selected and unselected bit lines B0,B1. Slightly after switches S12 are actuated, switches 13 associated with all the unselected bit lines B0,B1, are actuated precharging the capacitances CB0,CB1 associated with the unselected bit line B0,B1 to about −0.6 V. At this point, slightly after the actuation of switches S13, switch S3 associated with memory cell 1,1 is actuated changing the voltage on interconnections 8 from ISTB to VREFW dropping the voltage on interconnections 8 by about 500mV. Then, the read currents Io from sources 6 flow in both the selected and unselected bit lines. In the latter, currents Io flow into sources VREF2 which are still connected to bit line B0,B1 via switches S13 which are still in their actuated state. This occurs because switches S13 present an essentially short-circuit path to sources VREF2 as opposed to a higher resistance path through cell 1,2, for example. In the former, currents Io have no paths to sources VREF2 because switches S13 remain open so they flow into the selected memory cell 1,1 when its associated word line potential is switched to VREFW. It should be recalled, at this point, that the bit line capacitances CB0,CB1 of the selected bit line are not precharged to the VREF2 voltage. In this way, the large bit line currents from the bit line capacitances CB0,CB1 of a selected memory cell are added to the read current Io that flows in the selected memory cell 1,1. It should be noted that prior to the actuation of switch S12, capacitances CB0,CB1 of the selected cell were connected to VREF1 (0 volts) and that when switches S13 of the unselected bit lines are actuated, their associated bit line capacitances are charged to the voltage VREF2 (−0.6 volts). The read currents Io which flow into the selected cell cause a higher bit line voltage at the ON side of memory cell 1,1 primarily because of the higher current through its associated resistor RBW. The above reading approach, with large bit line currents from the selected bit line capacitances CB0,CB1 flowing through the selected memory cell in addition to reducing the read delay as will be shown below, permits read current sources 6 to be activated relatively late, thereby allowing the use of low-speed complementary transistor (PNP) switches for switch S13 resulting in a substantial power saving.

The above described cell read select approach virtually eliminates any wrong dynamic read signal currents in the presence of a worst-case bit pattern as discussed in connection with FIGS. 2,4. This results from the fact that parasitic, dynamic read currents from unselected bit line capacitances are shunted to VREF2 by means of switch S13. Also, the substantially simultaneous switching of switches S12, S13 and S3 prevents the parasitic read current from the unselected cells associated with the selected bit lines from having sufficient time to build up a wrong dynamic voltage signal at the bit lines.

Figure 7:
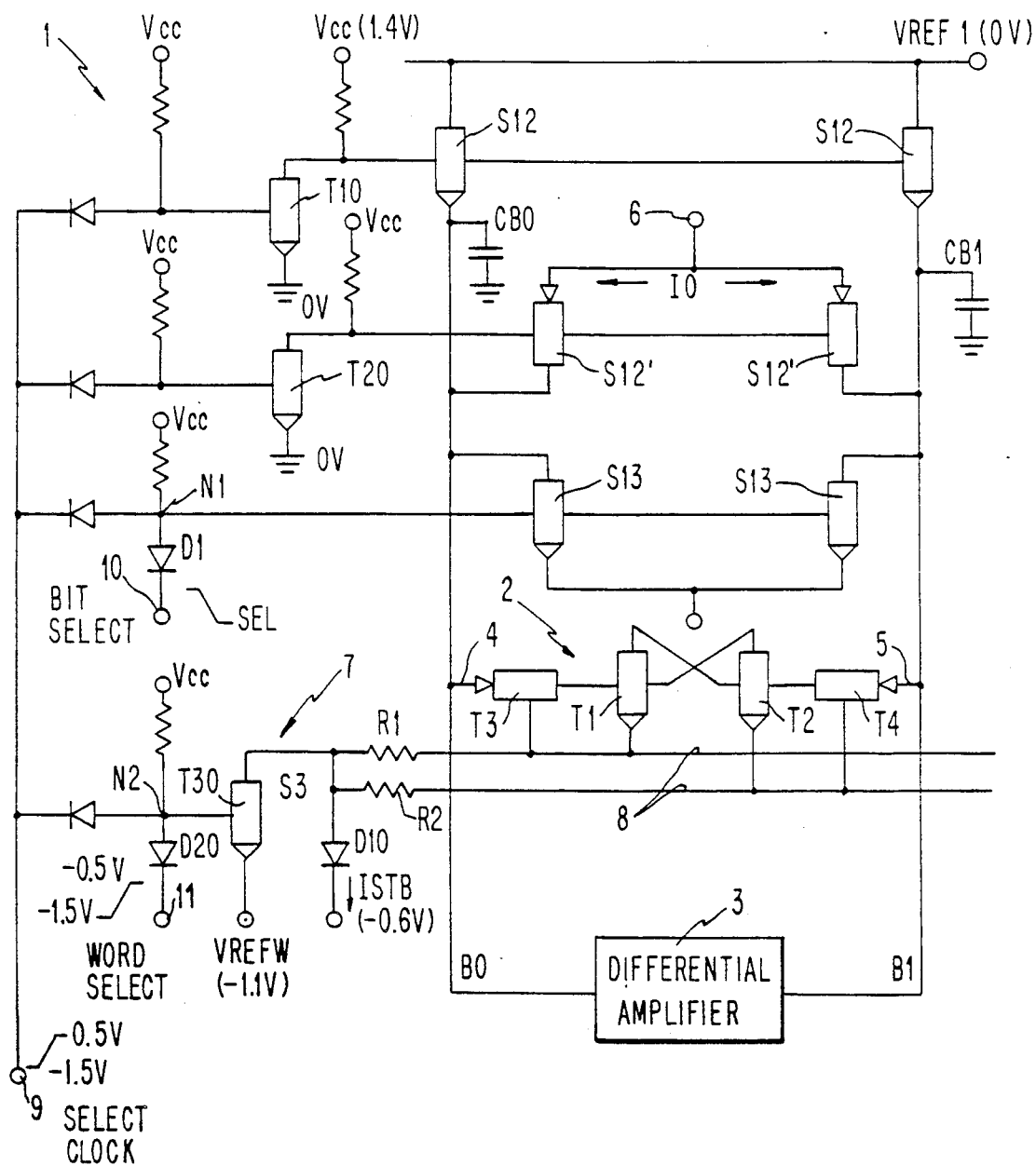
FIG. 7 is a schematic diagram of a portion of the arrangement of FIG. 5 both of which are implementations of a cell select scheme with parallel bit line precharge.
Figure 8:
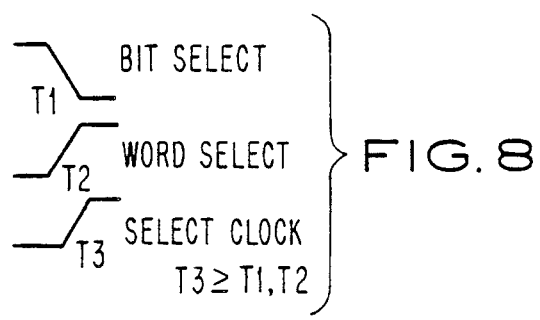
FIG. 8 shows a number of pulsed waveforms versus time which are utilized to initiate the BIT DECODE, WORD DECODE and SELECT CLOCK functions in the circuit of FIG. 7.

Referring now to FIG. 7, there is shown a schematic diagram of a portion of the arrangement shown in FIG. 5 both of which are implementations of a cell select scheme with parallel bit line precharge. FIG. 7 shows but a single memory cell, its associated bit and word lines and associated circuitry which apply the pulsed waveforms shown in FIG. 8 to it to carry out the functions of word and bit decoding, precharging, reading and the like. Where applicable, the same reference characters have been utilized in FIG. 7 as were used in FIGS. 2 and 5.

In FIG. 7 memory cell 2, consisting of devices T1-T4, are connected as shown in FIG. 1 to bit lines B0,B1 via interconnections 4,5 respectively, and to word line interconnections 8. A pair of NPN transistors, S12, serially disposed in bit lines B0,B1 are connected at their collectors to VREF1 and supply restore and standby potentials to the bit lines.

A pair of read current pnp transistors, S12', connected at their emitters to a read current source 6 (otherwise identified in FIG. 7 as ITOTAL) and at their collectors to bit lines B0,B1, provide read currents Io when rendered conductive by a signal applied to a terminal 9 otherwise identified in FIG. 7 as SELECT CLOCK. In FIG. 7, a pair of npn precharge transistors S13 are connected at their emitters to precharge voltage source VREF2 and at their collectors to bit lines B0,B1.

transistors S13 are controlled by signals on their bases from node N1. The potential on node N1 is, in turn, controlled by a signal on terminal 10 otherwise identified in FIG. 7 as BIT DECODE. Thus, when the bit decode signal on terminal 10 falls, diode D1 is conductive and the potential on node N1 is such that transistors S13 are rendered nonconductive. When, however, the bit decode signal is high, diode D1 is rendered nonconductive and a current from $V_{cc}$ renders transistors S13 conductive.

In FIG. 7, word line interconnections 8 with their serially disposed resistors R1,R2 are normally connected to a standby voltage source ISTB via a diode D10 which acts as the normally closed portion of word select switch S3. An npn transistor T30 is connected at its collector in parallel with diode D10 and its emitter is connected to VREFW. The base of transistor T30 is connected to a node N2 which is disposed between a resistor and a diode D20 which form an inverter. Diode 20 is connected to a terminal 11 otherwise identified in FIG. 7 as WORD SELECT. When the word select signal is low, diode D20 is conductive and the potential appearing at node N2 and at the base of transistor T30 renders it nonconductive. When the word select signal rises, diode D20 is rendered nonconductive and a current from $V_{cc}$ flows to the base of transistor T30 rendering it conductive and lowering the word line potential to VREFW, when the signal at SELECT CLOCK is high. Assuming bit lines B0,B1 in FIG. 7 to be selected bit lines, the circuit of FIG. 7 operates as follows. When the signal at SELECT CLOCK rises, it causes npn transistor T10 to become conductive applying zero potential to the bases of transistors S12 turning these devices OFF and isolating voltage source VREF1 from bit lines B0,B1. At the same time, all unselected bit lines are disconnected from voltage source VREF1.

Simultaneously with this, npn device T20 is also rendered conductive, placing zero bolts on the bases of pnp transistors S12' turning these devices ON, supplying read currents Io from ITOTAL which pass to memory cell 2. In passing through memory cell 2, they imbalance one side or the other depending on the state of the cell. This action duplicates the action of switch 12 in FIG. 6 which when actuated isolates bit line B0,B1 from VREF1 and causes Io to flow into the bit lines and from thence to memory cell 2.

To the extent that bit lines B0,B1 are selected, they remain disconnected from VREF2. In the selected condition, the BIT SELECT signal at terminal 10 goes low causing diode D1 to conduct placing the low signal on node N1. This causes npn devices S13 to become inoperative, preventing bit line capacitances CB0,CB1 from precharging to VREF2.

If bit lines B0,B1 are unselected, bit line capacitances CB0,CB1 be precharged, and therefore transistors S13 are rendered conductive. With the BIT SELECT signal high, node N1 receives a current from $V_{cc}$ which, when applied to the bases of devices S13, renders them conductive thereby precharging the bit line capacitances CB0,CB1 to the potential of VREF2.

At the same time, bit lines B0,B1 are being selected, a word line is being similarly selected. Prior to the actuation of the select clock signal on terminal 9, diode D10 in series with ISTB is conductive and maintains memory cell 2 in the condition in which it was previously written. At the same time, npn device T30, which forms a part of S3, is maintained in the OFF condition because diode D20 is conducting with the WORD SELECT signal on terminal 11 in the low or unselected condition. When the select clock signal on terminal 9 rises and the WORD SELECT signal on terminal 11 also rises to the select condition, diode D20 ceases conducting and $V_{cc}$ delivers a current to node N2. This current applied to the base of device T30 causes it to conduct and the voltage VREFW is applied to memory cell 2 via word line interconnections 8. At this point, the bit lines B0,B1 and a word line have been selected; VREF1 has been disconnected from bit lines B0,B1 and read current Io flows through memory cell 2 along with large dynamic currents, IDYN, which flow from the bit line capacitances. The latter have remained at the potential of VREF1 because they have not been precharged as opposed to the bit line capacitances of unselected bit lines which have been precharged to the potential of VREF2. Then, depending on the state of the cell, unbalanced currents flow in resistors R1,R2. These unbalanced currents are then sensed by differential amplifier 3 in the usual well known way. If memory cell 2 were unselected, bit line capacitances CB0,CB1 associated with them would be precharged by keeping the BIT SELECT signal applied to diode D1 at the high or unselected level. Under these conditions, diode D1 is nonconductive and the voltage at node N1 applied to the bases of devices S13 render them conductive precharging CB0,CB1 to VREF2 via these devices.

When a memory cell 2 is being read and bit line B0,B1 are unselected, the read currents, Io, which flow in unselected as well as selected bit lines, flow via switch S13 to the precharge voltage source, VREF2.

Figure 9:
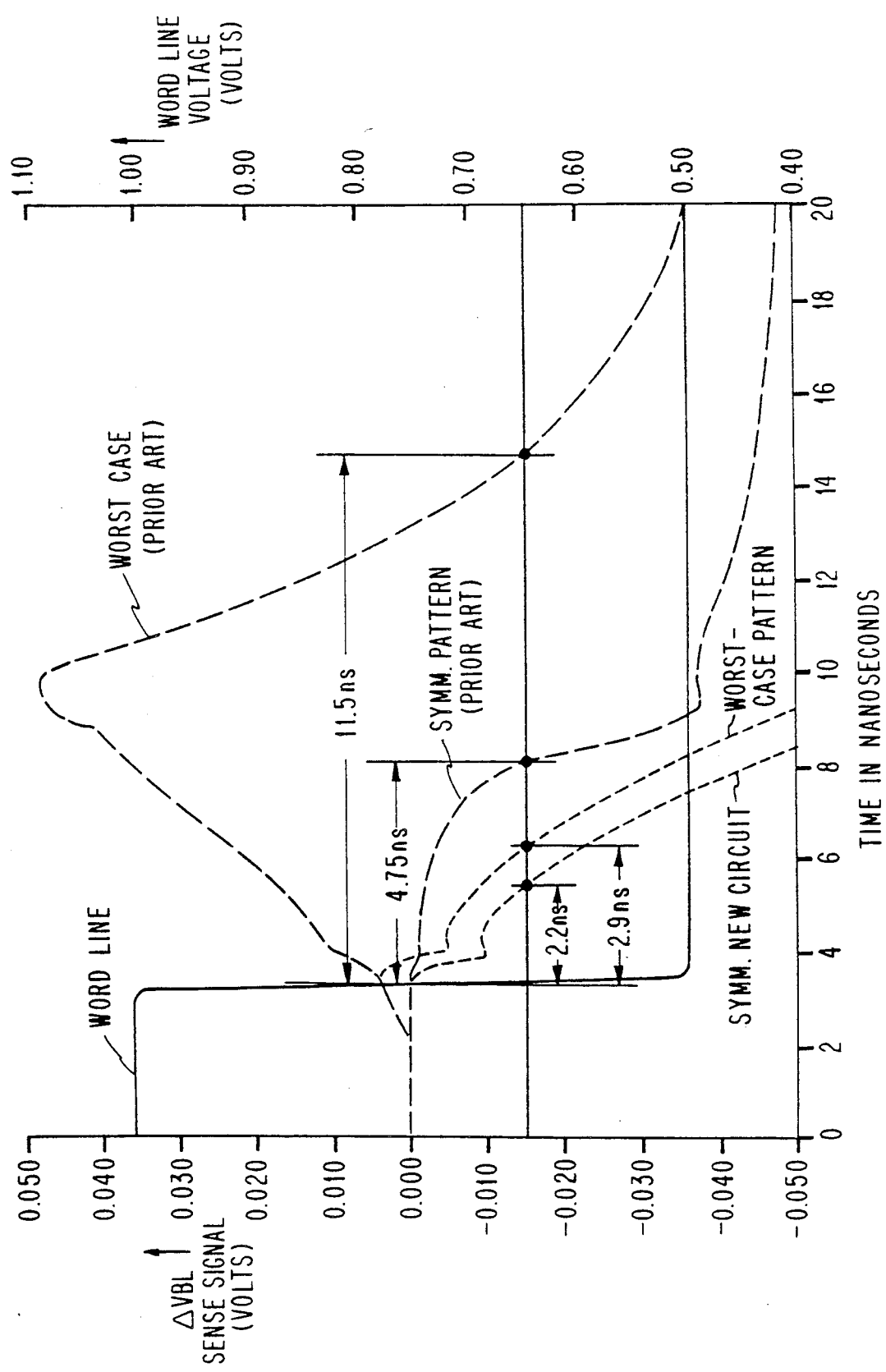
FIG. 9 is a plot of Bit Line Sense Signals and Word Line Voltage in volts versus time in nanoseconds for the circuits of both FIG. 7 and FIG. 4 which clearly shows the improvement obtained by the circuit of FIG. 7 over the prior art.

In the circuit just described, a single select clock signal at terminal 9 triggers all the required functions substantially simultaneously. Thus, bit lines B0,B1 are disconnected from the VREF1 supply; the current sources supplying read current, Io, are activated; the precharge function in conjunction with a BIT SELECT signal is enabled and the word select function in conjunction with a WORD SELECT signal is also enabled. Since the WORD SELECT output signal generally has the longest path delay, all the other functions are deliberately delayed by the SELECT CLOCK resulting in a minimum cell access time. As shown by the curves of the bit line sense signals in FIG. 9, not only has the delay variation between symmetrical and worst-case bit patterns been reduced, but the delay for the worst-case bit pattern for the circuit of FIG. 7 has also been reduced to less than the delay for the symmetrical bit pattern of the prior art circuit. Note that the symmetrical bit pattern delay for the new circuit is two times better than that for the prior art circuit and the delay for the worst-case bit pattern for the new circuit is approximately four times better than that for the prior art circuit.

When a write operation is carried out using the circuit of FIG. 7, that operation (not explained in detail herein) is also simplified. The same select operation can be used except that one of selected bit lines is pulled down by a write switch forcing the selected cell into a desired binary state.

As can be seen from the foregoing, the circuit of FIG. 7 provides a substantially reduced cell access time since the large worst-case bit pattern delay of the prior art has been substantially reduced. In addition, the access time variation between symmetrical and worst-case bit pattern delays of the prior art has been reduced and all functions are carried out using a single clock. Finally, because there are no resistors in the select, precharge and restore paths, only very small voltage swings are required for bit line, word line and control signals resulting in a good speed/power ratio for peripheral circuits.

In connection with the embodiment shown in FIG. 7, it should be appreciated that the conductivity types of the transistors and the polarities of the voltage sources may be reversed in the well known way without departing from the spirit and teaching of the present invention.

Having thus described our invention what we claim as new and desire to secure as Leters Patent, is:

1. A static random access, split-emitter memory cell array comprising:
    a plurality of split-emitter memory cells arranged in rows and columns to form an array, having read, write, standby and restore states,
    each of said rows of memory cells being connected to a word line,
    each of said columns of memory cells being connected to a pair of bit lines,
    a data sensing means connected to each of said pair of bit lines for reading information stored in a selected memory cell, said selected memory cell chosen from said plurality of split-emitter cells, and,
    a charging means connected to each of said bit lines for charging the capacitances of bit lines not connected to said selected memory cell.

2. A static random access, split-emitter memory cell, as in claim 1, further comprising:
    a data retention means connected to each of said pair of bit lines for maintaining the state of said memory cells connected to each of said pair of bit lines when all of said memory cells are in a standby state, and
    a word selection means connected to each of said word lines for applying a first potential to a word line during a standby state and a second potential to a word line during a selected state.

3. A static random access, split-emitter memory cell, as in claim 1 wherein:
    said charging means supplies read current to each of said bit lines not connected to said selected memory cell.

4. A static random access, split-emitter memory cell, as in claim 2, wherein:
    said data sensing means disconnects said data retention means from said pair of bit lines connected to said selected cell before said word selection means connects said second potential to a word line connected to said selected cell during a selected state.

5. A static random access, split-emitter memory cell, as in claim 3, wherein:
    said charging means connects a third potential to each of said bit lines not connected to said selected memory cell.

6. A static random access, split-emiter memory cell, as in claim 2, wherein:
    said charging means supplies read current to each of said bit lines not connected to said selected memory cell.

7. A static random access, split-emitter memory cell, as in claim 6, wherein:
    said charging means connects a third potential to each of said bit lines not connected to said selected memory cell.

8. A static random access, split-emitter memory cell, as in claim 7, wherein:
    said data sensing means disconnects said data retention means from said pair of bit lines connected to said selected cell before said word selection means connects said second potential to a word line connected to said selected cell during a selected state, and
    said charging means connects said third potential to said bit lines not connected to said selected memory cell after said data sensing means disconnects said data retention means and before said word selection means connects said second potential to a word line connected to said selected cell.

9. A static random access, split-emitter memory cell array, as in claim 2, wherein said charging means includes a voltage source, a pair of switchable bipolar transistors, a first electrode of each of said transistors being connected to said voltage source, a second electrode of each of said transistors being connected to a different bit line of said pair of bit lines, and a third electrode of each of said transistors being connected together and to a select signal, said pair of switchable bipolar transistors connect said pair of bit lines to said voltage source when said select signal is in a first state and said pair of switchable bipolar transistors disconnect said voltage source from said pair of bit lines when said select signal is in a second state.

10. A static random accesss, split-emitter memory cell array as in claim 9, wherein said data retention means comprises, a switchable bipolar transistor serially connected in each bit line of each of said bit line pairs, one electrode of each of said transistors being connected to said voltage source and a second electrode of each of said transistors being connected to a different bit line of said pair of bit lines and a third electrode of each of said transistors being connected together and to a select circuit, said select circuit having two states, said data retention means supplies current to said bit lines when said select circuit is in a first state and said bit lines are disconnected from said data retention means when said select circuit is in a second state.

11. A static random access, split-emiter memory cell array, as in claim 10, wherein said charging means comprises a current source, a pair of bipolar transistors one electrode of each of said transistors being connected to said current source, a second electrode of each of said transistors being connected to a different one of said pair of bit lines and the third electrode of each of said pair of transistors being connected together and to a select circuit, said charging means supplies current to said bit lines when said select circuit is in a second state and said charging means is disconnected from said bit lines when said select circuit is in said first state.

12. A static random access, split-emitter memory cell array, as in claim 11, wherein said select circuit comprises an inverter circuit connected to a voltage bias source and to a pulsed voltage source, said pulsed voltage source controls said select circuit state.

13. A static random access, split-emitter memory cell array, as in claim 12, wherein said word selection means comprises an inverter connected to a voltage bias source and to a pulsed voltage source said pulsed voltage source controls said potential applied to said word line during said standby and selected states.

14. A static random access, split-emitter memory cell array, as in claim 13, wherein said data sensing means comprises a differential amplifier connected across each of said pair of bit lines.

* * * * *